(12) United States Patent
Zhang

(10) Patent No.: US 7,974,092 B2
(45) Date of Patent: Jul. 5, 2011

(54) COMPUTER ENCLOSURE WITH COVER MOUNTING APPARATUS

(75) Inventor: Hai-Long Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 231 days.

(21) Appl. No.: 12/248,638

(22) Filed: Oct. 9, 2008

(65) Prior Publication Data

US 2010/0033925 A1 Feb. 11, 2010

(30) Foreign Application Priority Data

Aug. 5, 2008 (CN) ........................ 2008 2 0301738 U

(51) Int. Cl.
*G06F 1/16* (2006.01)
*H05K 5/00* (2006.01)
*H05K 7/00* (2006.01)

(52) U.S. Cl. .................................................. 361/679.58

(58) Field of Classification Search ............. 361/679.02, 361/679.31, 679.33, 679.57, 679.58
See application file for complete search history.

(56) References Cited

U.S. PATENT DOCUMENTS

| | | | | |
|---|---|---|---|---|
| 5,116,261 A * | 5/1992 | Lan et al. | ...................... | 312/292 |
| 6,209,975 B1 * | 4/2001 | Lai | ............................. | 312/223.2 |
| 6,390,320 B2 * | 5/2002 | Hurst et al. | ................... | 220/241 |
| 6,483,710 B1 * | 11/2002 | Reasoner et al. | ............. | 361/726 |
| 6,899,407 B1 * | 5/2005 | Lai | ............................. | 312/223.2 |
| 7,054,144 B2 * | 5/2006 | Heistand et al. | ......... | 361/679.57 |
| 7,082,036 B2 * | 7/2006 | Cheng et al. | ................... | 361/726 |
| 7,095,609 B2 * | 8/2006 | Erickson et al. | ......... | 361/679.59 |
| D550,576 S * | 9/2007 | Millar et al. | .................. | D10/106 |
| 7,272,011 B2 * | 9/2007 | Chen et al. | ..................... | 361/726 |
| 7,312,999 B1 * | 12/2007 | Miyamura et al. | ............ | 361/724 |
| 2002/0176232 A1 * | 11/2002 | Reasoner et al. | ............. | 361/726 |
| 2003/0026074 A1 * | 2/2003 | Clements et al. | ............. | 361/695 |
| 2004/0079711 A1 * | 4/2004 | Hartman et al. | ................ | 211/26 |
| 2004/0196623 A1 * | 10/2004 | Erickson et al. | ............. | 361/683 |
| 2004/0233619 A1 * | 11/2004 | Heistand et al. | ............. | 361/679 |
| 2005/0046316 A1 * | 3/2005 | Chen et al. | .................. | 312/223.2 |
| 2005/0057127 A1 * | 3/2005 | Chen et al. | .................. | 312/223.2 |
| 2006/0291155 A1 * | 12/2006 | Chen et al. | ..................... | 361/683 |

* cited by examiner

*Primary Examiner* — Jayprakash N Gandhi
*Assistant Examiner* — Adrian S Wilson
(74) *Attorney, Agent, or Firm* — Clifford O. Chi

(57) ABSTRACT

An computer enclosure includes a chassis having a bottom wall and a rear wall perpendicular to the bottom wall, a cover coupled to the rear wall of the chassis, two securing posts configured to extend through securing holes of the rear wall protruding from the cover, and a securing member pivotally attached to the rear wall of the chassis and capable of being rotated about a pivot axis. The securing member includes two opposite extending blocking ends for respectively engaging with the two securing posts of the cover, in which one blocking end is connected to a resilient member to provide an elastic force for urging the securing member to engage with the securing posts.

12 Claims, 4 Drawing Sheets

COMPUTER ENCLOSURE WITH COVER MOUNTING APPARATUS

BACKGROUND

1. Field of the Invention

The present invention relates to a computer enclosure with simply mounting structure for a cover thereof.

2. Description of Related Art

A cover of a computer system needs to be frequently removed for servicing or upgrading the computer system and then reattached. Typically, a cover mounting mechanism generally utilizes a plurality of screws to attach the cover to a computer chassis. Thus, a screwdriver or another tool is necessary for installation or removal of the cover, which is time consuming and inconvenient. As a result, many new cover mounting mechanisms have been introduced. Some mounting apparatuses do not require the use of screwdrivers or other tools to assemble or remove the cover. These mounting apparatuses have become popular, due to convenience. However, most of the new mounting apparatuses are assembled by a plurality of components and operation of the mounting apparatuses is unduly complicated.

Therefore, a computer enclosure with a simple mounting apparatus for a cover is desired to overcome the above-described shortcomings.

DETAILED DESCRIPTION OF THE EMBODIMENTS

Figure 1:
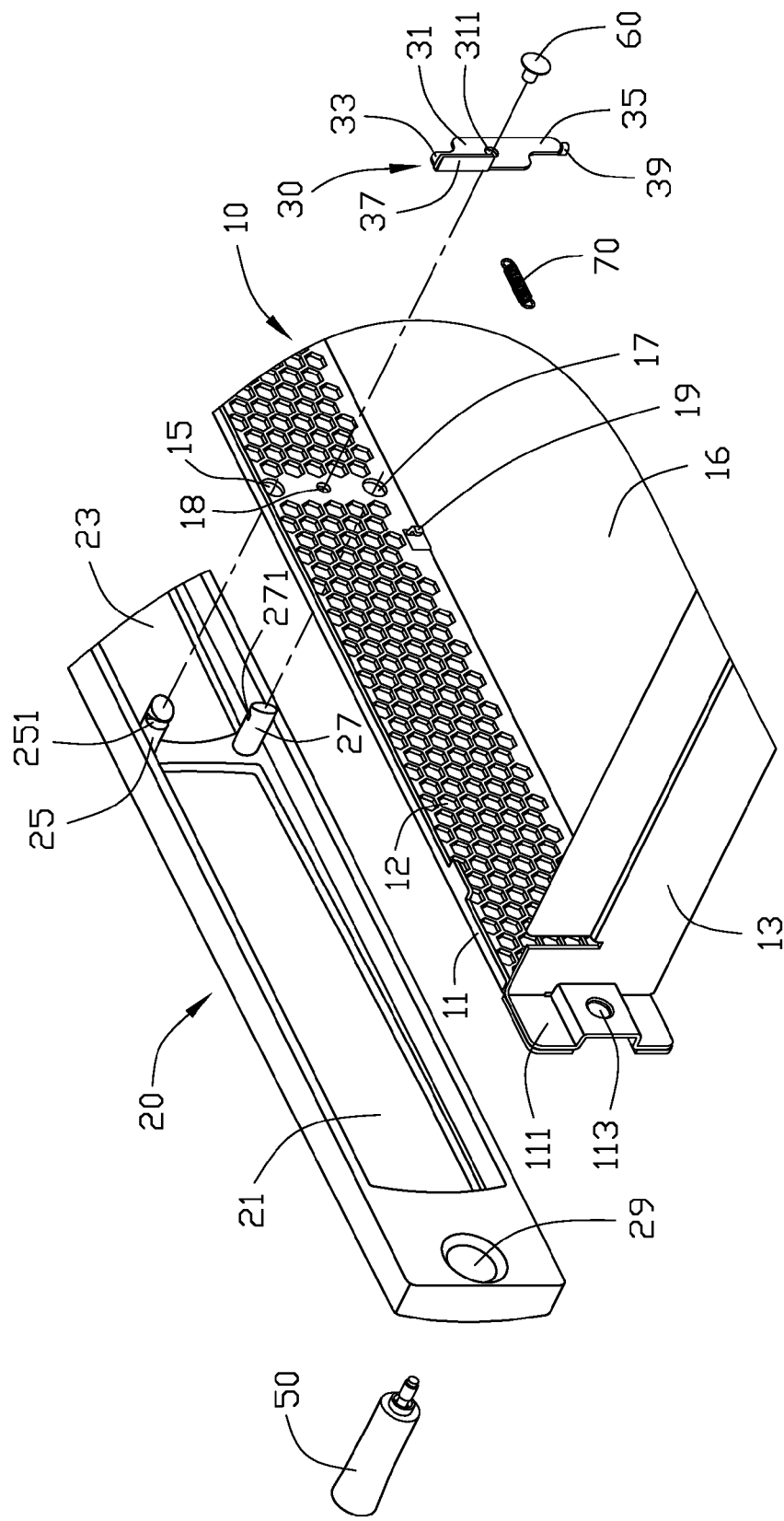
FIG. 1 is an exploded, isometric view of an embodiment of a computer enclosure, the computer enclosure including a chassis, a cover, and a securing member.

Referring to FIG. 1, a computer enclosure includes a chassis 10, a decorative and protecting cover 20, and a securing member 30 for mounting the cover 20 to the chassis 10.

The chassis 10 includes a rear wall 11, a sidewall 13 perpendicular to the rear wall 11, and a bottom wall 16 perpendicular to the rear wall 11 and the sidewall 13. A mounting area is defined in the rear wall 11 separating the rear wall 11 into two heat dissipating areas. Each heat dissipating area defines a plurality of heat dissipating holes 12 therein. A pivot hole 18, a first securing hole 15, and a second securing hole 17 are defined in the mounting area. The pivot hole 18 is aligned with the two securing holes 15 and 17 in a direction perpendicular to the bottom wall 16 of the chassis 10. A first hook 19 protrudes from an inner side of the rear wall 11 of the chassis 10 adjacent to the second securing hole 17. A positioning end 111 extends from the rear wall 11 and is perpendicular to the sidewall 13. A positioning hole 113 is defined in a middle portion of the positioning end 111.

The cover 20 is capable of being coupled to the chassis 10, and has a configuration corresponding to the rear wall 11 of the chassis 10. A first opening 21 and a second opening 23 defined in the cover 20 correspond to the two heat dissipating areas of the rear wall 11. A first securing post 25 corresponding to the first securing hole 15 and a second securing post 27 corresponding to the second securing hole 17 protrude from the cover 20 between the spaced openings 21 and 23. The first positioning post 25 defines a first securing slot 251 toward the first opening 21, and the second positioning post 27 defines a second securing slot 271 toward the second opening 23, such that the first securing slot 251 and the second securing slot 271 face opposite directions. A positioning hole 29 defined in the cover 20 adjacent to the first opening 21 corresponds to the positioning hole 113 of the rear wall 11 of the chassis 10.

The securing member 30 includes a rectangular base portion 31. A pivot hole 311 is defined in a middle of the base portion 31. A pivot member 60 extends through the pivot hole 311 in the securing member 30 and the pivot hole 18 in the rear wall 11 of the chassis 10, thereby pivotally attaching the securing member 30 to the rear wall 11 of the chassis 10. A first blocking finger 33 corresponding to the first securing slot 251 extends from a first corner of the base portion 31. A second blocking finger 35 corresponding to the second securing slot 271 extends from a second corner of the base portion 31. The first blocking finger 33 and the second blocking finger 35 are formed at two diagonal corners of the base portion 31. A second hook 39 protrudes from an end of the second blocking finger 35. An operating handle 37 perpendicularly extends from an edge of the first blocking finger 33 for providing support to rotate the securing member 30.

Figure 2:
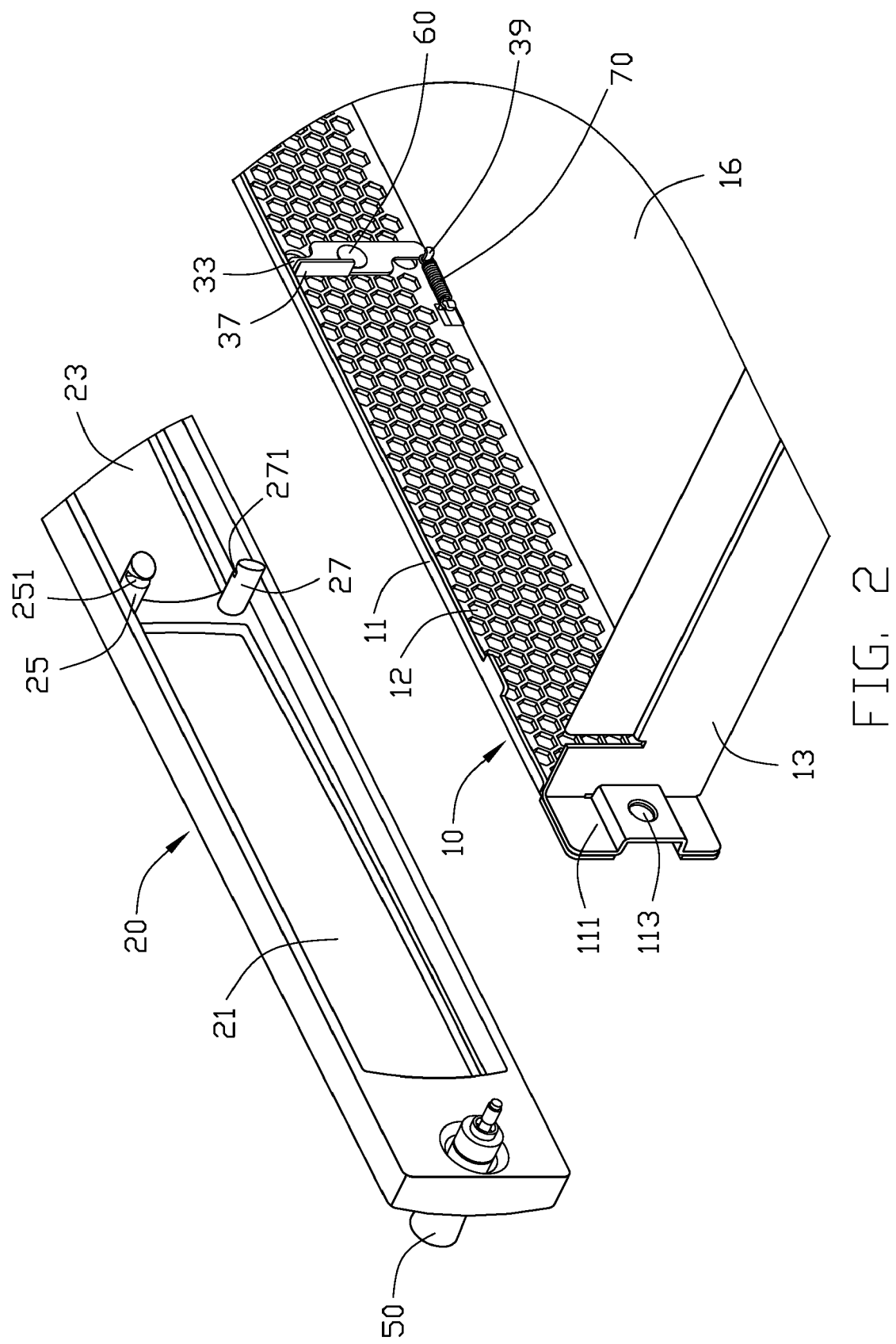
FIG. 2 is an exploded, isometric view of the cover, the chassis, and the securing member assembled with the chassis of the computer enclosure of FIG. 1.
Figure 3:
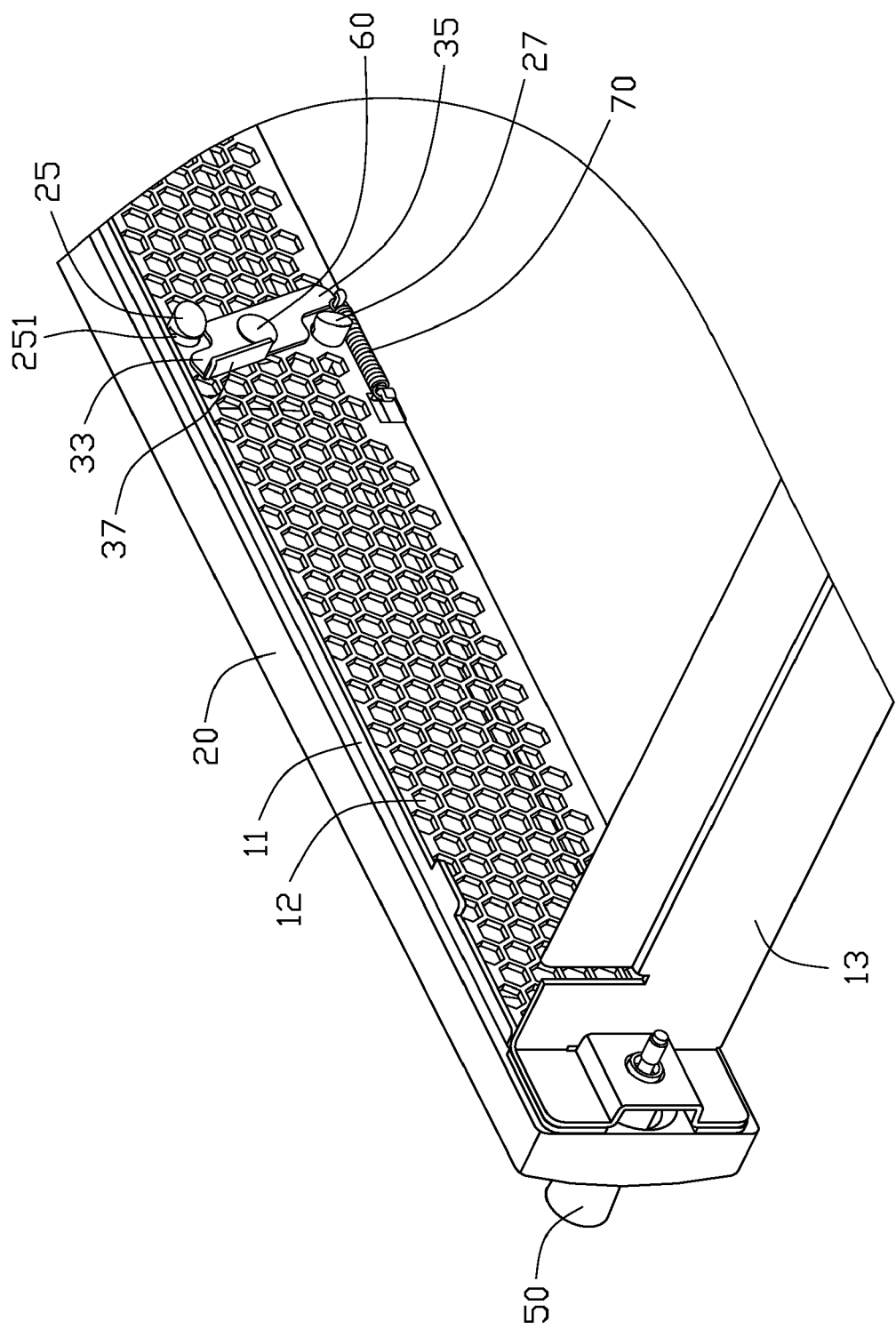
FIG. 3 is an assembled, isometric view of the computer enclosure of FIG. 1 when the securing member is in a rotated state.
Figure 4:
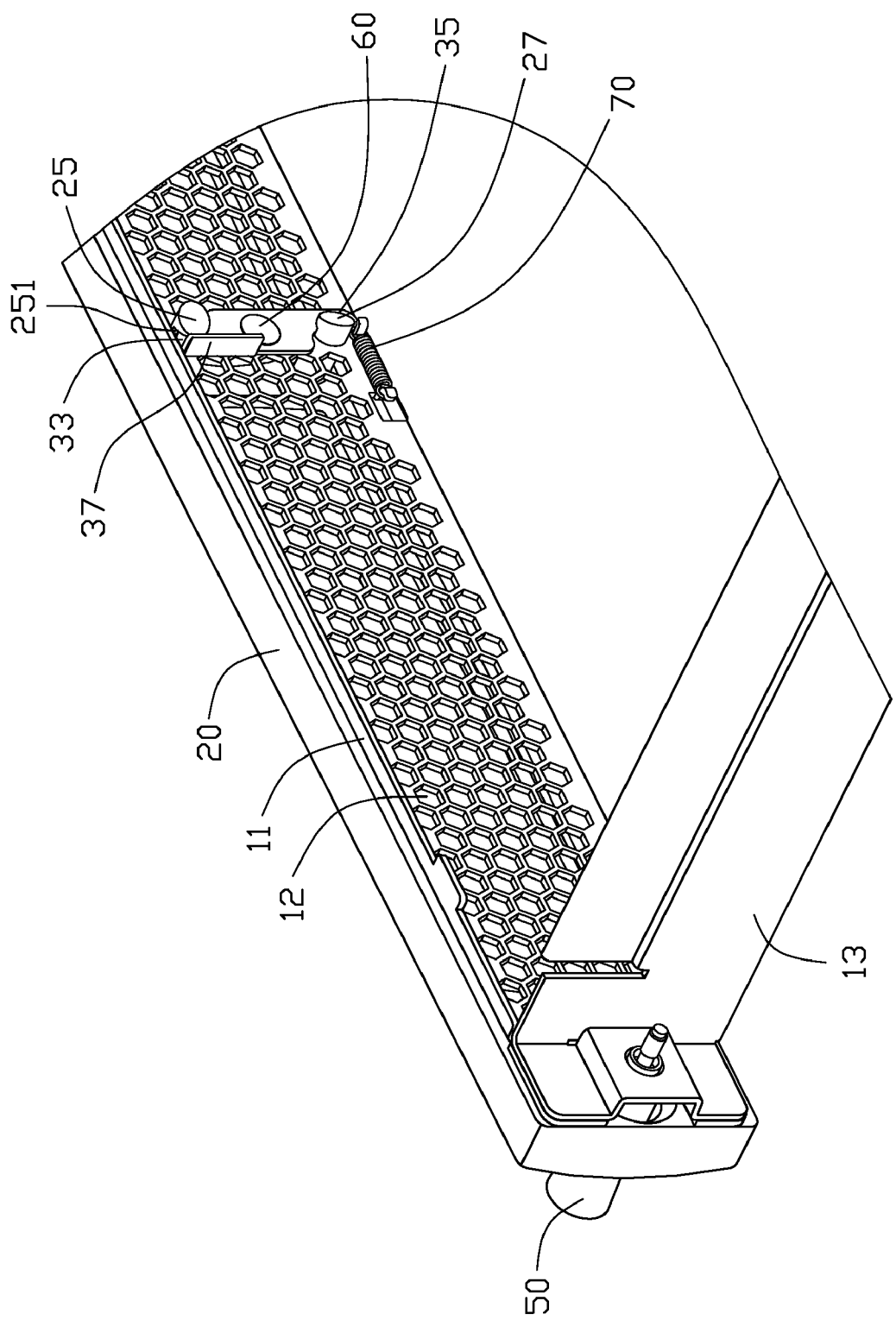
FIG. 4 is an assembled, isometric view of the computer enclosure of FIG. 1 when the securing member engages with the cover.

Referring to FIGS. 2 through 4, the pivot fastener 60 extends through the pivot hole 311 in the securing member 30 and the pivot hole 18 in the rear wall 11 of the chassis 10 to pivotally attach the securing member 30 to the inner side of the rear wall 11, so that the securing member 30 is capable of being rotated about a pivot axis defined by the pivot fastener 60. A fixed end of a spring 70 is engaged to the first hook 19 of the rear wall 11, and a movable end of the spring 70 catches the second hook 39 of the securing member 30. When the securing member 30 is in an initial state, the first blocking finger 33 of the securing member 30 covers part of the first securing hole 15 in the rear wall 11, and the second blocking finger 35 covers part of the second securing hole 17 in the rear wall 11. When the securing member 30 is rotated about the pivot axis by pressing the operating handle 37, the securing holes 15 and 17 allow the securing posts 25 and 27 to extend through the securing holes 15 and 17. In one embodiment, the spring 70 becomes stretched and provides an elastic force for driving the securing member 30 to rotate back to the initial position. In another embodiment, the elastic force for driving the securing member 30 to rotate back to the initial position can be obtained by compressing the spring 70. When the operating handle 37 is released, the securing member 30 is driven to move back to the initial position by the elastic force. The first blocking finger 33 engages in the first securing slot 251 and the second blocking finger 35 engages in the second securing slot 271. Thus, the cover 20 is mounted to the rear wall 11 of the chassis 10 by the securing member 30. In one embodiment, a secondary positioning member 50 passes through the positioning holes 29 in the cover 20 and the positioning hole 113 of the rear wall 11 of the chassis 10 to further secure the cover 20 to the chassis 10.

When disassembling the cover 20 from the rear wall 11 of the chassis 10, the operating handle 37 is pressed. The first blocking finger 33 moves toward the spring 70, and the second blocking finger 35 moves away from the spring 70, thereby stretching the spring 70 to produce the elastic force. The blocking fingers 33 and 35 disengage from the securing slots 251 and 271. Then, the secondary positioning member 50 is released from the chassis 10, and the cover 20 is removed from the chassis 10.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer enclosure comprising:
    a chassis having a bottom wall and a rear wall perpendicular to the bottom wall, the rear wall defining two securing holes;
    a cover coupled to the rear wall of the chassis, and comprising two securing posts protruding from the cover configured to extend through the securing holes in the rear wall, a securing slot defined in a side of each securing post, and the two securing slots facing towards opposite directions and parallel to the bottom wall; and
    a securing member pivotally attached to the rear wall of the chassis and capable of being rotated about a pivot axis, the securing member comprising two opposite extending blocking ends configured for engaging with the two securing posts of the cover, one of the two blocking ends being connected to a resilient member to provide an elastic force for urging the securing member to engage with the securing posts.

2. The computer enclosure of claim 1, wherein a pivot hole is defined between the two securing holes in the rear wall, and the pivot hole is aligned with the two securing holes in a direction perpendicular to the bottom wall of the chassis.

3. The computer enclosure of claim 2, wherein the securing member further comprises a base portion, the two blocking ends extend from two diagonal corners of the base portion, and are capable of covering part of the securing holes due to the elastic force provided by the resilient member.

4. The computer enclosure of claim 3, further comprising a pivot fastener, wherein a pivot hole corresponding to the pivot hole in the rear wall is defined in a middle portion of the base portion of the securing member; the pivot fastener extends through the pivot holes in the rear wall and the securing member to pivotally attach the securing member to the chassis.

5. The computer enclosure of claim 1, wherein a first hook positioned adjacent to a first hole of the securing holes protrudes from the rear wall of the chassis; a second hook protrudes from a first end of one of the two blocking ends; the resilient member is connected between the two hooks.

6. The computer enclosure of claim 5, wherein an operating handle extends perpendicularly from an edge of a second end of the blocking ends for providing support to rotate the securing member.

7. A computer enclosure, comprising:
    a cover comprising two securing posts protruding from the cover, a securing slot defined in a side of each securing post, and the two securing slots facing towards opposite directions and parallel to the bottom wall;
    a chassis having a bottom wall and a rear wall perpendicular to the bottom wall, the rear wall defining two securing holes for the two securing posts to protrude therethrough, a pivot hole being defined between the two securing holes; and
    a securing member pivotally attached to the rear wall of the chassis and capable of being rotated about the pivot hole, the securing member comprising two blocking ends capable of covering part of the securing holes of the rear wall and engaging with the two securing posts, wherein a first end of one of the two blocking ends being resiliently connected to the rear wall, the securing member being rotatable between a first position and a second position; in the first position, the securing member is away from the securing holes, and the two securing posts are able to be inserted into the two securing holes; and in the second position, the two blocking ends of the securing member are engaged with the two securing posts.

8. The computer enclosure of claim 7, wherein the pivot hole and the two securing holes are aligned in a direction perpendicular to the bottom wall of the chassis.

9. The computer enclosure of claim 8, wherein the securing member further comprises a base portion, the two blocking ends extend from two diagonal corners of the rectangular base portion, and are capable of covering part of the securing holes due to the elastic force provided by a resilient member.

10. The computer enclosure of claim 9, further comprising a pivot fastener, wherein a pivot hole corresponding to the pivot hole in the rear wall is defined in a middle portion of the base portion of the securing member; the pivot fastener extends through the pivot holes in the rear wall and the securing member to pivotally attach the securing member to the chassis.

11. The computer enclosure of claim 7, wherein a first hook positioned adjacent to a first hole of the securing holes protrudes from the rear wall of the chassis; a second hook protrudes from a first end of the blocking ends; the resilient member is connected between the two hooks.

12. The computer enclosure of claim 11, wherein an operating handle extends perpendicularly from an edge of a second block of the blocking ends for providing support to rotate the securing member.

* * * * *